(12) United States Patent
Prokop et al.

(10) Patent No.: US 9,294,313 B2
(45) Date of Patent: Mar. 22, 2016

(54) RECEIVER WITH PIPELINED TAP COEFFICIENTS AND SHIFT CONTROL

(71) Applicant: LSI Corporation, San Jose, CA (US)

(72) Inventors: Tomasz Prokop, Pleasanton, CA (US); Volodmyr Shvydun, Los Altos, CA (US); Viswanath Annampedu, Schnecksville, PA (US); Amaresh V. Malipatil, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 16 days.

(21) Appl. No.: 14/146,920

(22) Filed: Jan. 3, 2014

(65) Prior Publication Data
US 2015/0195108 A1 Jul. 9, 2015

(51) Int. Cl.
H03H 7/30 (2006.01)
H03K 5/159 (2006.01)
H04L 25/03 (2006.01)
H03M 9/00 (2006.01)

(52) U.S. Cl.
CPC ............ *H04L 25/03057* (2013.01); *H03M 9/00* (2013.01); *H04L 2025/03535* (2013.01)

(58) Field of Classification Search
CPC ................................................. H04L 25/03057
USPC .................................. 375/233, 229, 354, 234
See application file for complete search history.

(56) References Cited

U.S. PATENT DOCUMENTS

| | | | |
|---|---|---|---|
| 7,483,420 B1* | 1/2009 | Esposito | 370/371 |
| 7,545,196 B1 | 6/2009 | Hutton et al. | |
| 7,760,829 B2* | 7/2010 | Machesney | 375/350 |
| 7,818,705 B1 | 10/2010 | Hutton et al. | |
| 8,020,027 B1* | 9/2011 | Hutton | 713/601 |
| 8,583,714 B2 | 11/2013 | Turner | |
| 2013/0243066 A1 | 9/2013 | Palusa et al. | |

OTHER PUBLICATIONS

Altera, DSP System Design in Stratix III Devices, Feb. 2008, v. 1.0 AN-504.*
Altera Corporation; DSP System Design in Stratix III Devices; Application Note 504; Feb. 2008, v.1.0.
LSI Patentability Search Report for L13-1268.

* cited by examiner

*Primary Examiner* — Qutbuddin Ghulamali
(74) *Attorney, Agent, or Firm* — Sheridan Ross P.C.

(57) ABSTRACT

A serializer-deserializer using series-coupled signal processing blocks to process digitized input symbols, each block having a coefficient input. Each of plurality of series-coupled coefficient delay elements has a control input and a coefficient output coupling to the coefficient inputs of a corresponding one of the signal processing modules, is controlled by a shift register having an input and a plurality of outputs, each one of the plurality of outputs coupled to the control input of a corresponding one of the coefficient delay elements. An adaptation unit has a flag output coupled to the input of the shift register, and a first coefficient output coupled to the input of a first one of the coefficient delay elements. The adaptation unit generates a flag when the adaptation unit generates a coefficient, and the coefficient is entered into the first one of the coefficient delay elements when the shift register receives the flag.

20 Claims, 3 Drawing Sheets

RECEIVER WITH PIPELINED TAP COEFFICIENTS AND SHIFT CONTROL

BACKGROUND

In many data communication applications, serializer and de-serializer (SERDES) devices facilitate the transmission of parallel data between two points across a serial link. Data at one point is converted from parallel data to serial data and transmitted through a communications channel to the second point where it received and converted from serial data to parallel data.

At high data rates, frequency-dependent signal loss occurring from the communications channel (the signal path between the two end points of a serial link), as well as signal dispersion and distortion, can occur. Ideally, without noise, jitter, and other loss and dispersion effects, a data eye at the receiver will exhibit a relatively ideal shape. In practice, the shape of the data eye changes with noise, jitter, other loss and dispersion effects, and with temperature and voltage variations. As such, the communications channel, whether wired, optical, or wireless, acts as a filter and might be modeled in the frequency domain with a transfer function. Correction for frequency dependent losses of the communications channel, and other forms of signal degradation, often requires signal equalization of the signal at a receiver.

Equalization through use of one or more equalizers compensates for the signal degradation to improve communication quality. Equalization may also be employed at the transmit side to pre-condition the signal. Equalization, a form of filtering, generally requires some estimate of the transfer function of the channel to set its filter parameters. However, in many cases, the specific frequency-dependent signal degradation characteristics of a communications channel are unknown, and often vary with time. In such cases, an equalizer with adaptive setting of parameters providing sufficient adjustable range might be employed to mitigate the signal degradation of the signal transmitted through the communications channel. Equalization might be through a front-end equalizer, a feedback equalizer, or some combination of both. The shape of the data eye also changes due to equalization applied to input signal of the receiver. In some systems, equalization applied by a transmitter's equalizer further alters the shape of the eye from the ideal.

If an analog equalizer is employed in the analog front-end (AFE), the data eye-operating margin improves. However, better performance might be achieved through use of a Decision Feedback Equalizer (DFE) in combination with an equalizer in the AFE. Classical DFE equalization cancels a significant amount of intersymbol interference (ISI) and opens up the vertical and horizontal data eye opening. In SERDES communication channels, DFE filtering is employed to cancel post-cursor ISI in the equalized channel's pulse response by subtracting the output of the DFE from an input signal. DFE filters include a number of taps, the number of which determines how well the post-cursor ISI might be cancelled by subtracting the output of the DFE from the input signal. The longer the filter length (i.e., the more filter taps), the more ISI terms might be cancelled, but at the expense of increasing DFE filter complexity and power consumption. Typically, the DFE coefficients are automatically adjusted with adaptive algorithms such as least mean square (LMS). In high speed applications the data path equalization components are most often implemented as analog, transistor level circuits and the adaptation is implemented as digital blocks.

An alternative approach implements only an analog to digital converter (ADC) in the AFE, and all other processing of the received signal is implemented fully in the digital domain. Such a Digital Signal Processing (DSP) data path offers better reliability, testability and flexibility, but presents implementation challenges due to lower clock speeds available in digital designs, leading to a need for greater parallelization of the DSP processing. One of the main equalization components, the DFE, is particularly difficult to parallelize due to its inherent feedback structure. One parallelization approach is to implement a fully "unrolled" DFE (the DFE is implemented without feedback paths), but this yields prohibitively large designs for practical applications, scaling exponentially with the number of tap coefficients or inversely with channel quality metrics.

In a fully digital SERDES receiver the equalization data path is fully implemented as digital blocks and typically follows a variable gain amplifier (VGA) and an ADC at the input. A typical digital data path comprises a feed forward equalizer (FFE), a DFE, and adaptation and calibration circuits. For a digital signal processor (DSP) implementation, the clock frequencies available in the digital data path are typically an order of magnitude, for example eight to sixteen times, slower than in case of the analog datapath equalization. To maintain the data rate through the receiver, the receiver data path is parallelized by the same factor (eight to sixteen times). DFE implementations do not parallelize efficiently due to the need of an immediate feedback from the previous bit to the next bit of processed data. To address this architectural feature in parallel implementations of the DFE, an unrolling technique may be used, but this yields prohibitively large designs for practical applications, scaling exponentially with the number of tap coefficients. For the typically needed six to ten tap DFE, the size/power cost is prohibitive.

In order to avoid the huge size/power penalty of a large parallelized DFE, a feed-forward equalizer (FFE) might be used in combination with a conventional DFE, with fewer taps, followed by a multi-stage pipelined decision feed-forward equalizer (DFFE), making the data path easier to parallelize and implement for very fast data rates. In order to cover all the significant ISI contributing positions in a given channel the processing delay of the DFFE might span several tens of signal symbol time intervals (samples) e.g., 40-50 samples. A parallel DFFE of this order of implementation having several taps on such a long delay line is relatively complex, and has high power consumption. Further, the samples are processed by the parallel DFFE stages using a set of coefficients that might change over time outside of the processing pipeline. The coefficients for any given set of samples being processed should not change and should "flow" with the processed samples as they make their way through the DFFE pipeline. However, such an implementation might be very complex and power intensive.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide an apparatus having a plurality of signal processing blocks, a plurality of coefficient delay elements, and a shift register. The plurality of signal processing blocks are configured to serially process a digitized input data stream, each block having a data input, a data output coupling to an input of a subsequent signal processing block, and a coefficient input. Each coefficient delay element has a control input, a coefficient input, a coefficient output coupled to a coefficient input of a subsequent coefficient delay element and to the coefficient input of a corresponding one of the signal processing modules. The shift register has an input and a plurality of outputs, the plurality of outputs coupled to the control inputs of corresponding ones of the coefficient delay elements.

BRIEF DESCRIPTION OF THE DRAWING FIGURES

Other aspects, features, and advantages of the present invention will become more fully apparent from the following detailed description, the appended claims, and the accompanying drawings in which like reference numerals identify similar or identical elements.

DETAILED DESCRIPTION

Figure 1:
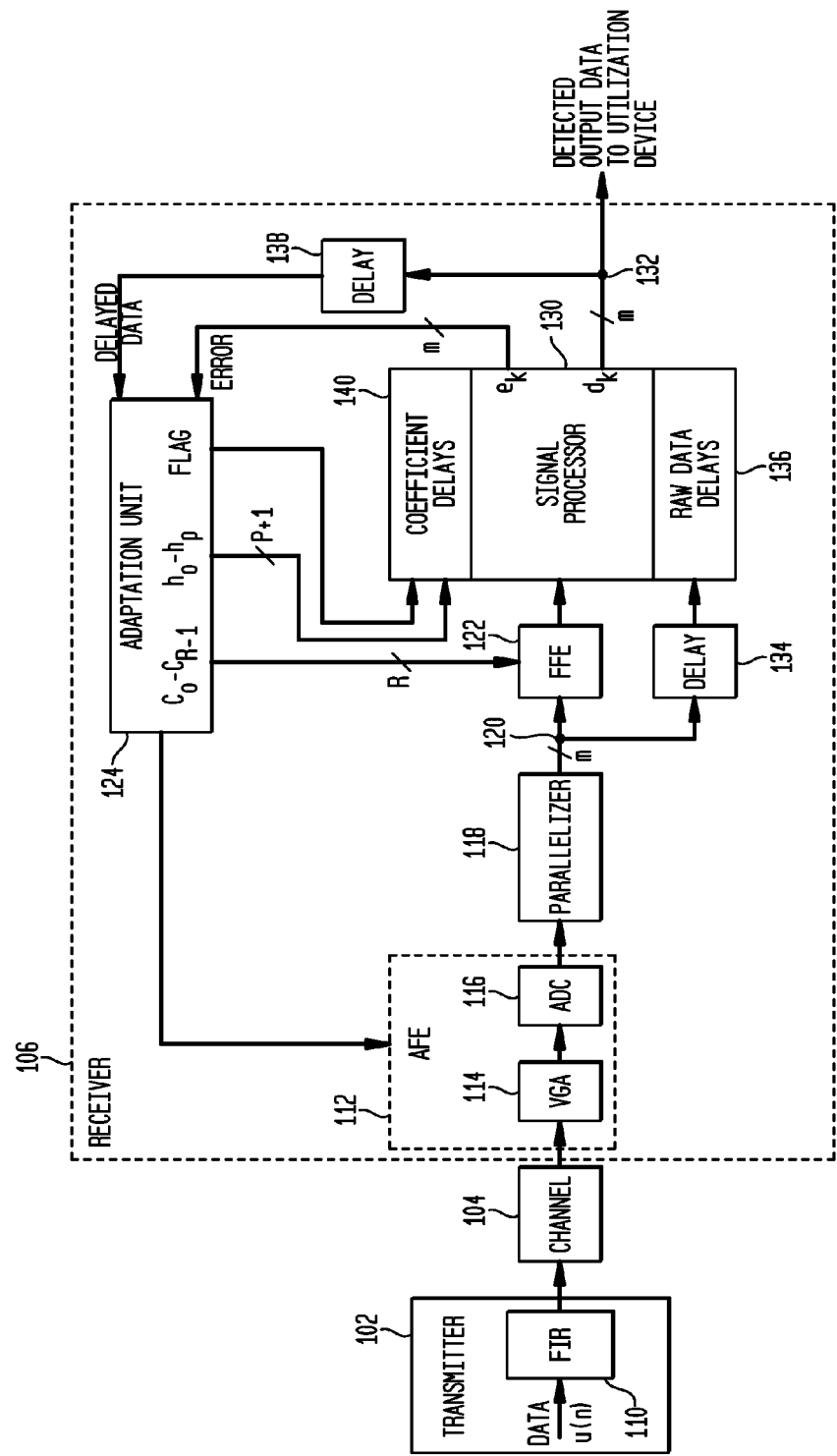
FIG. 1 shows an exemplary high level block diagram of a SERDES communication system employing a signal processor for parallel decision feed-forward and feedback equalization.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to be transferred between two or more elements, and the interposition of one or more additional elements is contemplated, although not required. Conversely, the terms "directly coupled", "directly connected", etc., imply the absence of such additional elements. Signals and corresponding nodes or ports might be referred to by the same name and are interchangeable for purposes here. The term "or" should be interpreted as inclusive unless stated otherwise. Further, elements in a figure having subscripted reference numbers, e.g., $100_1$, $100_2$, . . . $100_K$, might be collectively referred to herein using a single reference number, e.g., 100.

Moreover, the terms "system," "component," "module," "interface," "model," or the like are generally intended to refer to a computer-related entity, either hardware, a combination of hardware and software, software, or software in execution. For example, a component may be, but is not limited to being, a process running on a processor, a processor, an object, an executable, a thread of execution, a program, an application, or a computer. By way of illustration, both an application running on a controller and the controller can be a component. One or more components may reside within a process and/or thread of execution and a component may be localized on one computer and/or distributed between two or more computers.

Table 1 summarizes a list of acronyms employed throughout this specification as an aid to understanding the described embodiments of the invention:

TABLE 1

| ADC | Analog to Digital Converter | BER | Bit Error Rate |
|---|---|---|---|
| AFE | Analog Front End | DSP | Digital Signal Processing |
| CDR | Clock and Data Recovery | FIFO | First-In-First-Out |
| DFE | Decision Feedback Equalizer | FIR | Finite Impulse Response |
| DFFE | Decision Feed-Forward Equalizer | CMOS | Complementary Metal-Oxide-Semiconductor |
| FFE | Feed-Forward Equalizer | ISI | Inter-Symbol Interference |
| IC | Integrated Circuit | PAM | Pulse Amplitude Modulation |
| NRZ | Non-Return to Zero | RF | Radio Frequency |
| RX | Receive | SERDES | Serializer/Deserializer |
| SoC | System on Chip | VGA | Variable Gain Amplifier |

FIG. 1 shows a block diagram of exemplary serializer-deserializer (SERDES) communication system 100. As shown in FIG. 1, SERDES system 100 includes transmitter 102, communication channel 104, and receiver 106. As shown, transmitter 102 might optionally include finite impulse response (FIR) filter 110 for conditioning data before transmission to communication channel 104. In some embodiments, the function of FIR 110 might optionally be moved from transmitter 102 to receiver 106. Transmitter 102 receives data bits u(n) for transmission as serial data symbols, $u_k$, via communication channel 104, to receiver 106. Communication channel 104 might typically be a physical transmission medium, such as a backplane, drive head in a magnetic recording system, copper cables, or optical fibers.

Although described herein as being employed in a SERDES communication system, described embodiments are not so limited, and some embodiments might be employed in alternative communications systems employing a transmitter and a receiver communicating over a communication channel. The communication channel might be at least one of fiber optics, one or more coaxial cables, one or more twisted pair copper wires, and/or one or more radio frequency (RF) channels. Additionally, various signal modulation and de-modulation techniques might be employed. Further, although described herein as each "bit" of a signal having a corresponding logic value, it is understood that the various signals described herein might employ multi-bit data symbols based on various data encoding schemes, such as pulse amplitude modulation (e.g., PAM-4). Further, signal amplitudes might be expressed herein as −1 to 1 such as for Non-Return to Zero (NRZ) signaling, although any signal-encoding scheme might be employed.

After passing though communication channel 104, the analog transmit signal might be filtered or equalized by a conventional analog front end (AFE) 112 of receiver 106. AFE 112 comprises variable gain amplifier (VGA) 114 to amplify the received signal and an optional analog equalizer, and analog-to-digital converter (ADC) 116 that provides digital conversion of the input analog signal for processing by, for example, a digital signal processing (DSP) implementation of SERDES receiver 106. ADC 116 samples and digitizes the input analog signal based on timing and control of clock and data recovery (CDR) circuitry (not shown) that is based on a recovered clock signal based on timing of the received signal's data symbols. In this embodiment, the ADC 116 digitizes incoming equalized symbols from the VGA 114 and a "parallelizer" 118 converts or parallelizes the digitized symbols into a parallel format for transmission over bus 120. It is understood that the parallelizer might be part of the ADC 116 as ADC's output interface. In the embodiment shown here, the parallelizer 118 receives M sequential symbols at a time from the ADC 116 and produces an M-symbol "word" of "raw" (unprocessed) data on bus 120, having M lines, for presentation to an optional M-unit parallel feed forward equalizer (FFE) 122 employed to reduce precursor, and usually post-cursor, intersymbol interference (ISI), where M is an integer greater than one. An exemplary parallel FFE is described in "Parallel Implementation of the DSP Functions of the PAM-5 10 Gb/s Transceiver" by K. K. Parhi, C. Lutkemeyer, A. Abnous, and M. Hatamian, presented at the IEEE 802.3ae Plenary Meeting, March 2000, incorporated herein by reference in its entirety. Other parallel FFE designs can be used instead. Advantageously, by providing digitized symbols in parallel from the ADC 116, the symbol rate received by the receiver 106 is reduced by a factor of M to facilitate digital processing of the digitized symbols by the parallel unit FFE 122 and signal-processing block 130. For example, if the symbol rate is 12.5 giga-symbols per second (12.5 Gsps) and bus 120 carries eight symbols at a time (M=8), then each line of the bus 120 carries symbols at a rate of 12.5/8 Gsps or less than 1.6 Gsps, with a concomitant reduction in clock frequency for the FFE and DFE circuitry. It is understood that embodiments the parallelizer 118 include providing a serial-to-parallel converter to convert the serially received digitized symbols, pack together M symbols at a time, and output in parallel the M symbols with one clock pulse. In still another embodiment, the ADC 116 might be implemented as M analog-to-digital converters arranged such that each converter digitizes every $M^{th}$ equalized symbol to build up the M symbols for asserting onto bus 120.

Coefficients or tap weights $c_0$-$c_{Q-1}$ (Q is an integer greater than one) for the FFE 122 are supplied by the adaptation unit 124, the values thereof being adjusted in accordance with a conventional algorithm to reduce M error signals $e_k$ from the signal processor 130 below a threshold. As will be discussed in more detail below, a typical error signal processor (not shown) in the signal processor 130 generates M error signals $e_k$, each error signal corresponding to a difference between the M raw data symbols in the delay unit 136 with the corresponding time-aligned and processed (reconstructed) data signals from the processor 130.

Output from the M-channel FFE 122 are fed to M decision feedback equalizers ($DFE_1$-$DFE_N$, not shown) followed by N serially-coupled banks of M paralleled decision feed-forward equalizers ($DFFE_1$-$DFFE_N$, not shown) in signal processor block 130, as will be described in more detail below regarding FIGS. 2 and 3. As will be explained in more detail, the signal processor 130 processes the FFE-equalized symbols from FFE 122 to reduce post-cursor ISI from the received signal and thereby produce M detected data bits $v_k$ in parallel for eventual presentation on M-bit output bus 132. The M detected data bits $v_k$ are provided to a utilization device, such as a computer (not shown), for further processing.

Because of the pipeline nature of the signal processor and that various blocks in the signal processor 130, such as an error calculation unit, requires the raw data from the parallel bus 120 to function. To do so, a delay element 134 and multiple serially-coupled delay elements in delay block 136 are provided to maintain time-alignment of the raw data from the bus 120 with data propagating though the signal processor 130. The delay provided by delay element 134 is equal to the delay of data through the FFE 122. For example, if the FFE 122 requires two clock cycles to complete equalization of the raw data on bus 122, then the delay provided by delay element 134 is also two clock cycles.

The coefficients or tap weights ($h_0$-$h_P$, P being an integer greater than one) to be used by the signal processor 130 come from the adaptation unit 124, the values thereof being adjusted in accordance with a conventional algorithm to reduce an M error signals $e_k$ from the signal processor 130 below a threshold. Because it is desirable for the coefficients to move with the data being processed and as will be described in more detail below, multiple serially-coupled delay elements in coefficient delay block 140 shift the coefficients $h_0$-$h_P$ received from the adaptation unit 124 in synchronism with the data passing through the signal processor 130 and the raw data in delay block 136.

The detected data bits v(k) on bus 132 are delayed by delay 138 and the delayed detected data bits are applied to adaptation unit 124. The delay 138 time-aligns the detected data on bus 132 with the M error signals $e_k$ from the signal processor 130 as it is applied to the adaptation unit 124.

In this embodiment, the adaptation unit 124 generates control signals for the AFE 112 and two or more groups of weighted tap values or coefficients, here $c_0$-$c_{R-1}$ and $h_0$-$h_P$, calculated based on an estimate of inter-symbol interference (ISI) present in the received signal. The coefficient signals $c_0$-$c_{R-1}$ (R is an integer greater or equal to zero) set the tap coefficients in the FFE 122, and the coefficient signals $h_0$-$h_P$ are the tap coefficients for the signal processor 130. The adaptation module 124 implements one or more of a variety of well-known adaptation algorithms, such as a least-mean-squares (LMS) algorithm, to iteratively reduce the error signals $e_k$ to below a threshold value by adjusting the coefficients.

Described embodiments of a receiver having a signal processor 130 formed from paralleled equalizers organized in blocks that provide linear scaling with the amount of parallelization and relatively little size increase as the number of coefficients is increased. As will be described, operation of the paralleled equalizers is based on sequential or pipelined block processing, with each block receiving coefficient values corresponding to the data being processed therein. Control over the movement of the coefficients is by a control shift register that controls clocking of the coefficient delay elements in delay block 140 associated with the signal processor 130. Optionally, the control shift register also controls the raw data delays in block 136.

Figure 2:
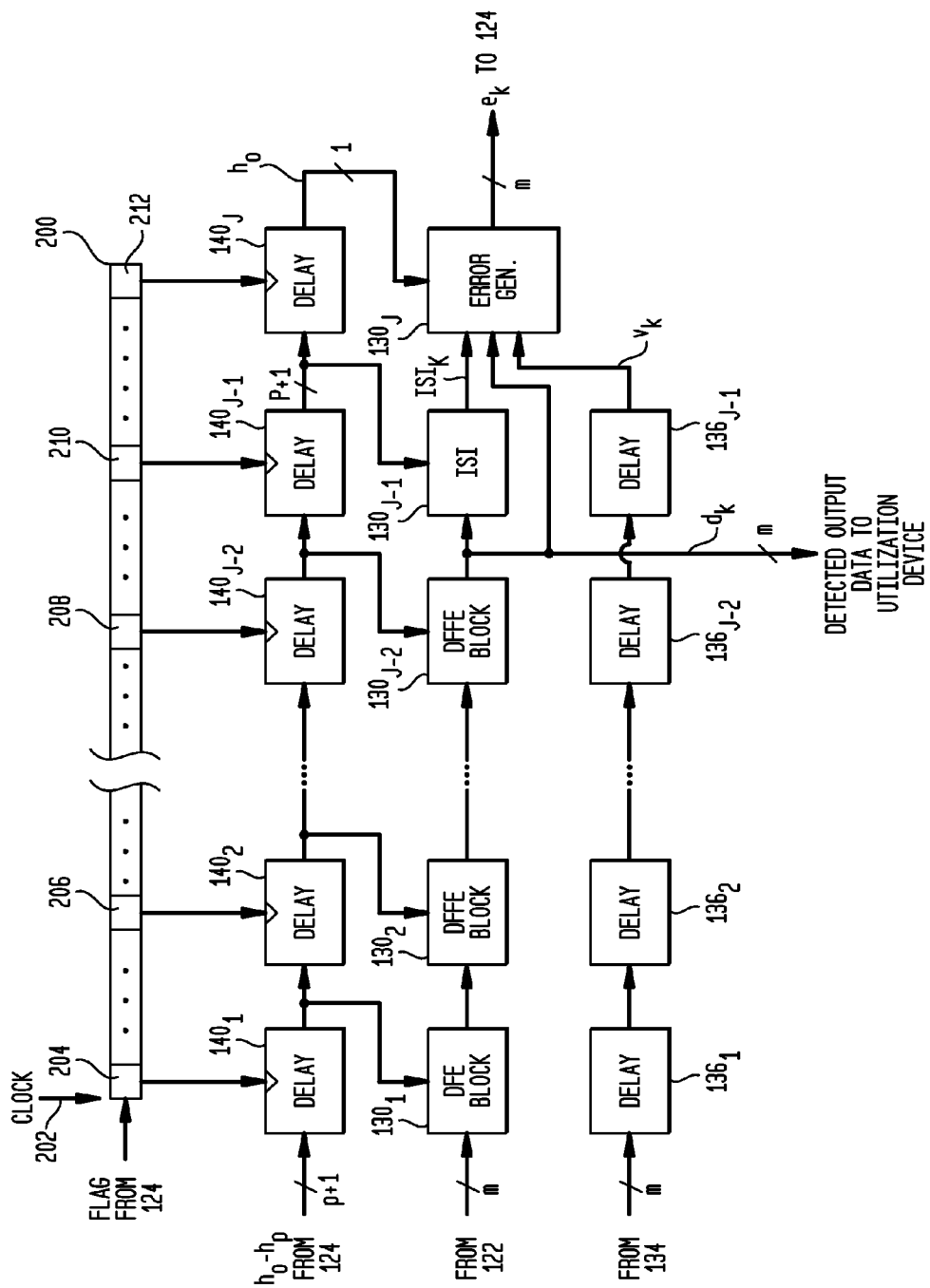
FIG. 2 shows a block diagram of an exemplary signal processor implementation in accordance with an exemplary embodiment of the invention.

In one exemplary embodiment shown in FIG. 2, the signal processor 130 in FIG. 1 is composed of J processing blocks $130_1$-$130_J$ of M units, the raw data delay block 136 in FIG. 1 is composed of J−1 delay elements $136_1$-$136_{J-1}$, and the coefficient delay block 140 is composed of J delay elements or registers $140_1$-$140_J$. In this embodiment, each processing block 130 receives M symbols in parallel, each unit in each block sending processed signals to the corresponding unit the immediately succeeding block. Similarly, a first delay element of the delay elements 136 and 140 receive respective M raw data signals and P+1 coefficients and each delay element sends the data/coefficient therein to the immediately succeeding delay element. In this embodiment, the delay each delay element 136 is tailored to the delay of the corresponding processing block 130 and might have more than one delay element therein to achieve the desired delay. For example, the processing block $130_2$ takes three clock cycles to process data, so that delay element $136_2$ also has a delay of three clock cycles. In an alternative embodiment, the delay elements 136 might be one large first-in-first-out memory so that the delay of the FIFO is the same as that of the combined processing blocks as measured from the input to block $130_1$ to the output of block $130_J$.

Because the outputs of coefficient delay elements 140 are coupled to each corresponding processing block 130, each delay element 140 is controlled by a shift register 200 composed of K flip-flops, where K is greater than or equal to J. Each delay element 140, such as a clocked D-type register, transfers and holds data (the P+1 coefficients) presented at its input when its control (clock) input transitions from one state to a second state, e.g., from a zero to a one, triggering the register. To control when the delay elements 140 transfers the coefficients from one delay element to the next, a flag propagating from one shift register element to the next in response to a clock 202 controls the triggering of the delay elements 140. As shown here, the first coefficient delay element $140_1$ is coupled to the output of flip-flop 204 such that, when the flag is present in the flip-flop 204, the delay element $140_1$ is triggered. Similarly, the second delay element $140_2$ is controlled by flip-flop 206, delay element $140_{J-2}$ by flip-flop 208, delay element $140_{J-1}$ by flip-flop 210, and delay element $140_J$ by flip-flop 212. The number of flip-flops in shift register 200 between those flip-flops with outputs coupled to the control inputs of delay elements 140 determines the delay measured in clock cycles between when a delay element is clocked and the immediately succeeding delay element is clocked. In an alternative embodiment, multiplexers might be added between selected control inputs of the delay elements 140 and the flip-flop outputs of the shift register 200 so that a control input can be coupled to different ones of the flip-flops to establish the amount of delay as needed.

To reduce the complexity of the delay elements 140 and in an alternative embodiment, instead of each of the multi-bit coefficients from the adaptation unit 124 being passed through the coefficient delay elements 140 in their entirety, a change in coefficient value (delta value) for each of the coefficients is generated by adaptation unit 124 and the delta values passed through the delay elements 140 instead. Because the number of bits required for each delta (e.g., two bits) might be significantly less than the number of bits in each coefficient (e.g., five bits), the number of bits in each of delay units and the amount of wiring between them is reduced accordingly.

The flag from adaptation unit 124 is generated each time the adaptation unit updates one or more of the P+1 coefficient signals $h_0$-$h_P$. The flag is cleared when the shift register 200 loads the flag into the first flip-flop 204. This selective clocking of the delay elements 140 serves to reduce power consumption since power consumption in complementary metal-oxide-semiconductor (CMOS) logic elements is generally proportional to the frequency the logic elements are clocked.

In the embodiment here, the first processing block $130_1$ is a conventional decision feedback equalizer (DFE) block, receiving M symbols from the FFE 122. Output from the DFE is passed to a first of N decision feed-forward equalizer (DFFE) blocks $130_2$-$130_{J-2}$, where N is one or more and less than J (in this embodiment, N=J−2). The DFFE blocks are hybrid equalizers and are used to further equalize the received signal in a power and area efficient manner. DFFEs are a hybrid of decision feedback and feed-forward equalizers: it is a feed-forward design like an FFE but uses DFE coefficients. One exemplary embodiment of a DFFE is described in published U.S. Patent Application No. 2013/0243066) included herein by reference in its entirety. A hybrid architecture combining elements of FFE, DFFE, and DFE might offer better noise performance than FFE alone, lower burst error propagation than DFE alone, equalization performance comparable to DFE but with much lower implementation cost due to the absence of bit-to-bit critical paths (as exist in typical DFE implementations), and improved performance when implemented in a cascaded manner.

Output from the $N^{th}$ DFFE $140_{J-2}$ is processed by an intersymbol interference (ISI) processor $130_{J-1}$. The ISI processor, in one embodiment, produces an estimation of the amount of ISI in each of the M data symbols after processing by the FFE 122, DFE $130_1$, and DFFEs $130_2$-$130_{J-2}$ as follows:

$$ISI_M = \sum_{i=1}^{P} h_i d_{k-i};$$

where $d_{k-i}$ are the previously processed data symbols from the DFFE block $130_{J-2}$. The ISI estimate is then passed to error generator block $130_J$ that calculates the error signal $e_k$ as the difference between the equalized signal (the raw data less the ISI estimate) and the reconstructed symbol:

$$e_k = v_k - ISI_k - h_0 d_k;$$

where $v_k$ is the raw data time-aligned with the processed data $ISI_k$ from the ISI processor $140_{J-1}$, and $d_k$ is the processed data symbol from the DFFE block $130_{J-2}$. In this embodiment, the last delay element $140_J$ holds one coefficient, $h_0$, that the error generator uses, saving chip area and power.

In another embodiment, outputs from the shift register 200 gate a clock signal, such as by ANDing the respective outputs of the shift register 200 and a clock signal, to clock the delay elements 140. In still another embodiment, the output of the shift register 200 controls a shift/hold control of the delay elements 140 so that a delay element holds its data until the flip-flop in the shift register enables the delay element to shift new data into it in response to a clock signal (not shown).

Figure 3:
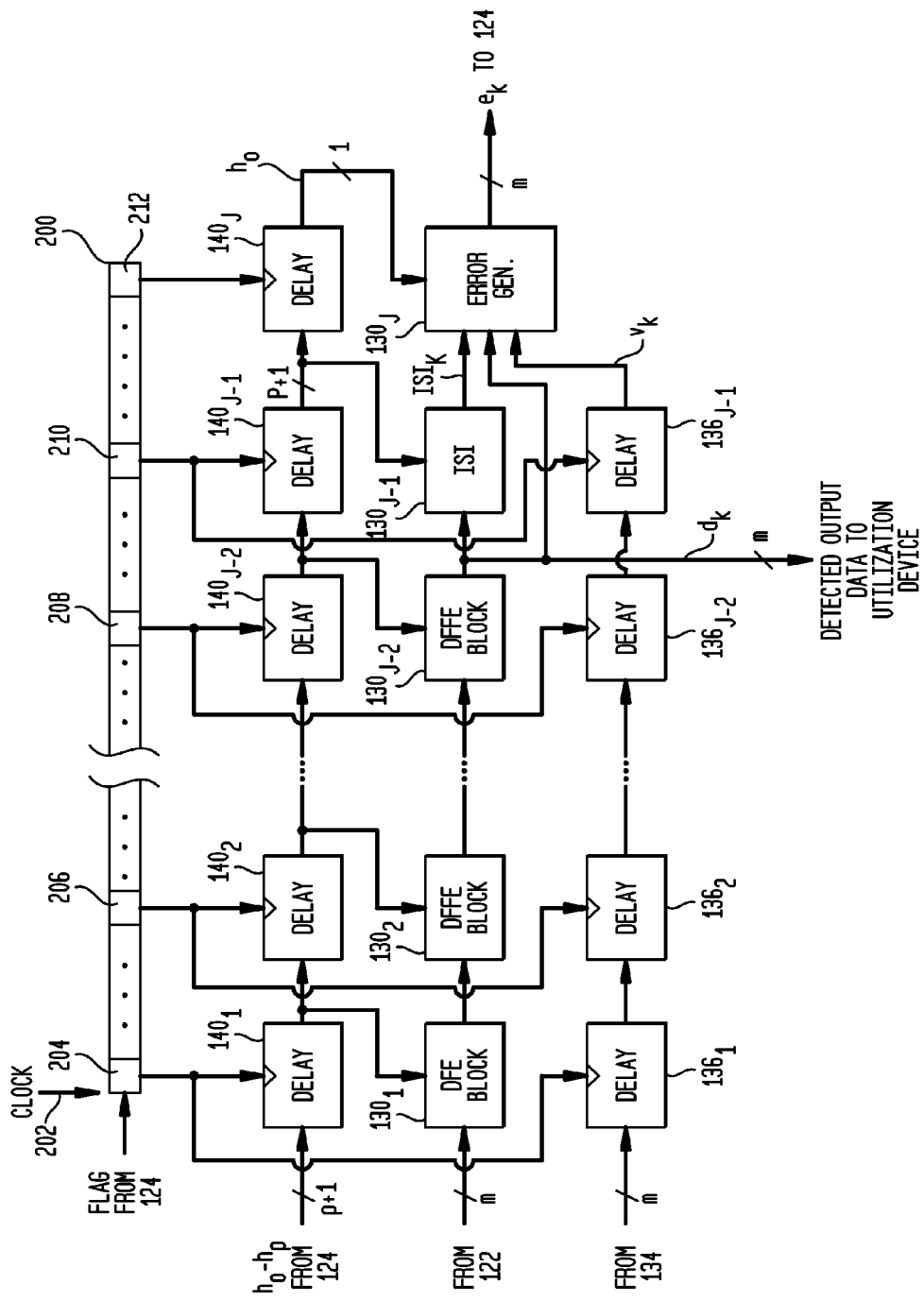
FIG. 3 shows an alternative embodiment of the exemplary signal processor implementation in accordance with an exemplary embodiment of the invention.

Another embodiment of the invention is shown in FIG. 3. This embodiment is substantially the same as the embodiment shown in FIG. 2 but each of the delay elements 136 are controlled by the same control signal from the shift register 200 as the corresponding ones of the delay elements 140.

While the embodiments here are described herein in connection with a SERDES receiver implementation, the invention is not so limited. The technique of using a shift register to control the timing of delay elements is applicable to pipelined processor architectures generally.

Although the embodiments have been described with respect to functional blocks, the embodiments may be implemented in a variety of ways, such as in or part of a single integrated circuit (IC), a multi-chip module, a single card, or a multi-card circuit pack, etc. but are not limited thereto. As would be apparent to one skilled in the art, the various functions might also be implemented as processing blocks in a software program. Such software might be employed in, for example, a digital signal processor, microcontroller, or general-purpose computer. Such software might be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. Described embodiments might also be manifest in the form of a bitstream or other sequence of signal values electrically or optically transmitted through a medium, stored magnetic-field variations in a magnetic recording medium, etc., generated using a method and/or an apparatus as described herein.

It is understood that embodiments of the invention are not limited to the described embodiments, and that various other embodiments within the scope of the following claims will be apparent to those skilled in the art.

We claim:

1. An apparatus comprising:
    a plurality of signal processing blocks configured to serially process a digitized input data stream, each block having a data input, a data output coupling to an input of a subsequent signal processing block, and a coefficient input;
    a plurality of coefficient delay elements, each coefficient delay element having a control input, a coefficient input, a coefficient output coupling to a coefficient input of a subsequent coefficient delay element and to the coefficient input of a corresponding one of the signal processing blocks;
    a shift register having an input and a plurality of outputs, the plurality of outputs coupled to the control inputs of corresponding ones of the coefficient delay elements; and
    an adaptation unit, having an input coupled to the data output of a last one of the signal processing blocks, a flag output coupled to the input of the shift register, and a first coefficient output coupled to the input of a first one of the coefficient delay elements;
    wherein the adaptation unit generates a flag on the flag output when the adaptation unit generates a coefficient, the flag is entered into the shift register and, in response, the generated coefficient is entered into the first one of the coefficient delay elements.

2. The apparatus of claim 1 wherein the shift register has at least as many outputs as there are coefficient delay elements and is configured to shift the flag through the shift register in response to a clock signal such that, when the flag appears at an output of the shift register, the coefficient delay element corresponding to that shift register output transfers data to its output from its preceding coefficient delay element.

3. The apparatus of claim 2, wherein each of the signal processing blocks has a processing delay, and the shift register is configured to cause each coefficient delay element to hold the coefficient therein for substantially as long as the processing delay of the corresponding the signal processing block.

4. The apparatus of claim 3, wherein the shift register comprises a plurality of serially-coupled flip-flops responsive to a common clock, each one of the plurality of outputs being from one of the serially-coupled flip-flops, the amount of delay between outputs of the shift register being a function of a number of flip-flops disposed between flip-flops having outputs coupled to the coefficient delay elements.

5. The apparatus of claim 2 further comprising:
    a plurality of serially-coupled delay blocks, each delay block corresponding to a signal processing block;
    wherein a first one of the delay blocks receives the digitized data stream, and an output of a last one of the delay blocks is coupled to the adaptation unit.

6. The apparatus of claim 5 wherein each of the serially-coupled delay blocks has a control input coupled to the control inputs of corresponding ones of the coefficient delay elements.

7. The apparatus of claim 5 wherein each of the signal processing blocks has a processing delay, and each delay block providing a delay substantially equal to the processing delay of the corresponding signal processing block.

8. The apparatus of claim 5 further comprising:
    a error generator, disposed between the last one of the signal processing blocks and the input of the adaptation block, and coupled to the output of the last one of the delay blocks.

9. The apparatus of claim 8 further comprising:
    an analog-to-digital converter configured to digitize an input signal to form the digitized input data stream.

10. The apparatus of claim 9 further comprising:
    an additional signal processor block, disposed between the analog-to-digital converter and the plurality of signal processor blocks, having a coefficient input; and
    an additional delay block disposed between analog-to-digital converter and the first delay block;
    wherein the adaptation unit has a second coefficient output, the second coefficient output coupled to the coefficient input of the additional signal processor block.

11. The apparatus of claim 10, wherein the additional signal processor unit is a feed-forward equalizer, the first one of the signal processing blocks is a decision-feedback equalizer, the last one of the signal processing blocks being an intersymbol interference processor, and remaining signal processor blocks being decision feed-forward equalizers.

12. The apparatus of claim 1, wherein the apparatus is embodied in a serializer-deserializer (SERDES) device.

13. The apparatus of claim 1 wherein the apparatus is disposed in an integrated circuit.

14. A method, comprising:
    serially processing a digitized input data stream with a plurality of signal processing blocks, each block having a data input, a data output coupling to an input of a subsequent signal processing block, and a coefficient input;
    coupling a plurality of coefficient delay elements to a corresponding one of the signal processing blocks, wherein each coefficient delay element comprises a control input, a coefficient input, and a coefficient output coupling to a coefficient input of a subsequent coefficient delay element as well as the coefficient input of the corresponding one of the signal processing blocks;
    coupling a shift register to the control inputs of corresponding one of the coefficient delay elements, wherein the shift register comprises an input and a plurality of outputs, the plurality of outputs being coupled to the control inputs of the corresponding ones of the coefficient delay elements;
    coupling an input of an adaptation unit to the data output of a last one of the signal processing blocks, the adaptation unit further comprising a flag output coupled to the input of the shift register, and a first coefficient output coupled to the input of a first one of the coefficient delay element; and
    generating a flag with the adaptation unit on the flag output when the adaptation unit generates a coefficient, the flag being entered into the shift register and, in response, the generated coefficient being entered into the first one of the coefficient elements.

15. The method of claim 14, wherein the shift register has at least as many outputs as there are coefficient delay elements and is configured to shift the flag through the shift register in response to a clock signal such that, when the flag appears at an output of the shift register, the coefficient delay element corresponding to that shift register output transfers data to its output from its preceding coefficient delay element.

16. The method of claim 15, wherein each of the signal processing blocks has a processing delay, and the shift register is configured to cause each coefficient delay element to hold the coefficient therein for substantially as long as the processing delay of the corresponding the signal processing block.

17. The method of claim 16, wherein the shift register comprises a plurality of serially-coupled flip-flops responsive to a common clock, each one of the plurality of outputs being from one of the serially-coupled flip-flops, the amount of delay between outputs of the shift register being a function of a number of flip-flops disposed between flip-flops having outputs coupled to the coefficient delay elements.

18. The method of claim 15, further comprising:
receiving the digitized data stream with a first one of a plurality of serially-coupled delay blocks, each delay block corresponding to a signal processing block, and wherein an output of a last one of the delay blocks is coupled to the adaptation unit.

19. A serializer-deserializer (SERDES) device, comprising:
a plurality of signal processing blocks configured to serially process a digitized input data stream, each block having a data input, a data output coupling to an input of a subsequent signal processing block, and a coefficient input;
a plurality of coefficient delay elements, each coefficient delay element having a control input, a coefficient input, a coefficient output coupling to a coefficient input of a subsequent coefficient delay element and to the coefficient input of a corresponding one of the signal processing blocks;
a shift register having an input and a plurality of outputs, the plurality of outputs coupled to the control inputs of corresponding ones of the coefficient delay elements; and
an adaptation unit, having an input coupled to the data output of a last one of the signal processing blocks, a flag output coupled to the input of the shift register, and a first coefficient output coupled to the input of a first one of the coefficient delay elements;
wherein the adaptation unit generates a flag on the flag output when the adaptation unit generates a coefficient, the flag is entered into the shift register and, in response, the generated coefficient is entered into the first one of the coefficient delay elements.

20. The SERDES device of claim 19, wherein the shift register has at least as many outputs as there are coefficient delay elements and is configured to shift the flag through the shift register in response to a clock signal such that, when the flag appears at an output of the shift register, the coefficient delay element corresponding to that shift register output transfers data to its output from its preceding coefficient delay element.

* * * * *